(12) United States Patent
Wieczorek et al.

(10) Patent No.: US 6,271,122 B1
(45) Date of Patent: *Aug. 7, 2001

(54) METHOD OF COMPENSATING FOR MATERIAL LOSS IN A METAL SILICONE LAYER IN CONTACTS OF INTEGRATED CIRCUIT DEVICES

(75) Inventors: Karsten Wieczorek, Reichenberg-Boxdorf; Michael Raab, Radebeul; Gert Burbach, Dresden, all of (DE)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/351,756

(22) Filed: Jul. 12, 1999

(51) Int. Cl.[7] ................................. H01L 21/4763
(52) U.S. Cl. ................. 438/627; 438/299; 438/586; 438/622; 438/625; 438/628; 438/630; 438/655; 438/682
(58) Field of Search ..................... 438/683, 682, 438/664, 656, 655, 630, 637, 622, 625, 627, 628, 629, 299, 586, 652–653, 654

(56) References Cited

U.S. PATENT DOCUMENTS

| | | |
|---|---|---|
| 4,994,410 | 2/1991 | Sun et al. ............................. 437/192 |
| 5,094,981 | * 3/1992 | Chung et al. ....................... 438/621 |
| 5,322,809 | * 6/1994 | Mosleshi ............................ 438/303 |
| 5,457,069 | * 10/1995 | Chen et al. ......................... 437/190 |
| 5,770,517 | 6/1998 | Gardner et al. .................... 438/627 |
| 5,998,873 | * 12/1999 | Blair et al. ......................... 257/766 |
| 6,081,016 | * 6/2000 | Tanaka et al. ..................... 257/377 |

FOREIGN PATENT DOCUMENTS

| | | |
|---|---|---|
| 0 305 147 A1 | 3/1989 | (EP) . |
| 0 400 877 A2 | 12/1990 | (EP) . |
| 0 453 029 A1 | 10/1991 | (EP) . |
| 0 506 129 A1 | 9/1992 | (EP) . |

OTHER PUBLICATIONS

Woo et al., "A High Performance 3.97 $\mu m^2$ CMOS SRAM Technology Using Self–Aligned Local Interconnect and Copper Interconnect Metallization".

Sambonsugi et al., "A Perfect Process Compatible 2.49 $\mu m^2$ Embedded SRAM Cell Technology for 0.13 $\mu m$–Generation CMOS Logic LSIs".

Inhohara et al., Highly Scalable and Fully Logic Compatible SRAM Cell Technology with Metal Damascene Process and W Local Interconnect.

* cited by examiner

Primary Examiner—Tuan H. Nguyen
Assistant Examiner—Thanhha Pham
(74) Attorney, Agent, or Firm—Williams, Morgan & Amerson, P.C.

(57) ABSTRACT

There is provided a semiconductor device comprising, for example, a MOS structure having a low electrical resistance in contacts and local interconnects, and a method for fabricating the device. When openings are formed in a dielectric region of a MOS structure, the thin metal silicide layer on top of a drain/source region is diminished due to the limited selectivity of the etch process and the need to over-etch to obtain appropriate electrical contacts. Consequently, the contact resistance is increased resulting in an increased contact resistance. Therefore, a bilayer metal is deposited on the metal silicide layer and the surface of the openings, wherein the metal layer that is in contact with the metal silicide layer is preferably the same metal as the metal of the metal silicide layer. In a subsequent annealing process, the metal of the bilayer partially converts into metal silicide, thereby increasing the initial metal silicide layer and concurrently reducing the contact resistance.

19 Claims, 2 Drawing Sheets

METHOD OF COMPENSATING FOR MATERIAL LOSS IN A METAL SILICONE LAYER IN CONTACTS OF INTEGRATED CIRCUIT DEVICES

BACKGROUND OF THE INVENTION

1. Field of the Invention

The present invention relates to the fabrication of integrated circuit devices, and, more particularly, to the formation of metallization layers in contacts and local interconnects of such devices, e.g., MOS transistor structures.

2. Description of the Related Art

The fabrication of integrated circuit devices involves numerous processing steps. One important aspect in the manufacturing procedure is to provide low resistivity connections between the various components of the integrated circuit devices, e.g., between the MOSFETs or bipolar devices of an integrated circuit (interconnects) as well as to components of a single device (local interconnect) or junctions to the semiconductor material (contacts). The latter type of electrical connections generally requires the formation of openings in a dielectric layer covering the wafer surface by means of an anisotropic etching process. Due to the demand of decreasing circuit sizes, the openings have substantially vertical sidewalls in order to save space. The openings are filled by a contact metal, such as tungsten, typically through use of a chemical vapor deposition process ("CVD"). However, difficulties in the deposition process arise as the adhesion of the metal to the sidewalls of the opening in the dielectric material is rather poor. Therefore, forming a thin adhesion layer, for example, a titanium layer, covering the sidewalls and the bottom of the opening has become a standard procedure.

A further issue which is steadily gaining in importance, particularly in view of the ever decreasing circuitry dimensions, is the problem of electromigration, i.e., material transport of the metallization layer caused by the flow of an electrical current. Electromigration may lead to discontinuities in the metallization layer and result in the failure of the electrical connection. In addition, the resistivity of the metal increases when electromigration occurs since voids appear within the metal and thereby reduce the area of the metal through which the charge carriers can pass. While tungsten is presently preferred to aluminum for formation of contact plugs because it is less susceptible to electromigration, there is still a need for improvement of the mechanical stability and the electrical characteristics of such contact plugs.

One illustrative prior art process for forming a contact plug will be explained with reference to FIG. 1. FIG. 1 shows a cross-section of a semiconductor topography representing an illustrative MOS transistor fabricated by prior art processing techniques. A composite barrier layer (adhesion layer) 15 composed of a titanium layer and a titanium nitride layer separates a local interconnect dielectric material 19 from a local interconnect metal plug 17. An illustrative cobalt silicide layer 9 is formed above the semiconducting substrate. The cobalt silicide layer 9 and the plug 17 are separated by a barrier layer 15. An active junction 3 is electrically connected to the plug 17 through the cobalt silicide layer 9. Two structures 3, as described above, representing the drain and source areas, respectively, are separated by the gate area consisting of a gate oxide 7 on which a polysilicon layer 6 is formed. A cobalt silicide layer 8 is also formed on top of the polysilicon layer 6. The side-walls of the gate stack are surrounded by a spacer material 11. The top of the gate stack is covered by the dielectric material 19.

The following is a brief description of one typical prior art process for making the structure as illustrated in FIG. 1. After the formation of a cobalt silicide layer 8, 9 by conventional silicide processing, a silicon-nitride etch-stop layer (not shown) of about 500–1500 Å (50–150 nm) is formed. Subsequently, a dielectric material 19, which may be formed from tetraethoxysilane (TEOS), doped or undoped, and possibly comprising an antireflecting coating is deposited. The dielectric material 19 may have a typical thickness of about 7000–8000 Å (700–800 nm). After the deposition of the dielectric material 19, and the completion of a chemical mechanical polishing step, a lithography step is carried out, wherein optical proximity corrections may be employed, depending on the feature size. Next, openings 2 are formed in the dielectric material 19 by an etching process, wherein the etching process stops on the etch-stop layer. In a further processing step, the etch-stop layer is removed from the bottom of the openings 2 by a selective etching process. Due to limited selectivity of this latter etching step with respect to the cobalt silicide layer 9, and the necessity to over-etch in order to avoid open contacts, the cobalt silicide layer 9 under 15 the openings 2 suffers a loss of material, resulting in an increased contact resistance of the remaining cobalt silicide layer 9 as compared to the initial cobalt silicide layer. After etching and removing the etch-stop layer, the barrier layer 15, typically consisting of titanium/titanium-nitride bilayer, is deposited. The openings 2 are then filled in with a metal, such as tungsten, by a chemical vapor deposition process, thereby forming a plug 17. In a further processing step, the excess tungsten and the excess barrier layer 15 on the top surface are removed by, for example, a chemical mechanical polishing operation.

As mentioned above, the barrier layer 15 (adhesion layer) is desirable to attain a sufficient adhesion of the metal, e.g., tungsten, on the sidewalls of the trenches during the deposition process. Moreover, the barrier layer 15 serves as a diffusion barrier in order to avoid an undesired interaction of the tungsten with the underlying layers, in particular, interaction with the doped area of the active junctions 3.

As a result, when contacts are opened and local interconnect trenches are formed, the cobalt suicide ($CoSi_2$) layer 9 is partially removed in the area beneath the openings 2 due to both the limited selectivity of the etch process, and the necessity to over-etch in order to avoid open electrical contacts. This problem is aggravated as shallow junctions in MOSFET devices require very thin silicide layers, due to the demand of decreased circuit dimensions. Therefore, the loss of even portions of the initial, thin silicide layer 9 during the etching process may strongly affect the quality of the remaining silicide layer, in particular with respect to its electrical resistance. Accordingly, the contact resistance of the remaining cobalt silicide ($CoSi_2$) layer 9 is increased, thus leading to an increased contact resistance to the underlying junction. In view of the above mentioned problem, a need exists for an integrated semiconductor device having a metallization comprising a metal silicide layer without the aforementioned process-related increase in contact resistance. Moreover, the material used for metallization layers should exhibit mechanical as well as chemical stability during the various processing steps.

The present invention is directed to a method for solving, or at least reducing the effects of, some or all of the aforementioned problems.

SUMMARY OF THE INVENTION

The present invention is generally directed to an improved method for forming metal contacts in a semiconductor device and a semiconductor device incorporating same. The method comprises forming a layer comprised of a metal silicide above a surface of a wafer, forming a dielectric layer above said metal silicide layer, forming an opening in the dielectric layer where a metal contact is to be formed, forming a barrier metal layer comprised of at least a first and second metal, the first metal being in contact with the metal silicide layer and being comprised of the same metal as said metal of said metal silicide layer, annealing the wafer in an inert gas to convert said second metal to a compound comprised of said second metal and said ambient gas, and said first metal is converted to a metal silicide of the same composition as said metal silicide layer.

In yet another illustrative embodiment of the present invention, the method comprises forming the barrier metal of at least a first and second metal, the first metal being in contact with said metal silicide layer, and the first metal being different from the metal of said metal silicide layer, and annealing the wafer to convert said first metal of said barrier metal to an additional metal silicide layer.

The semiconductor device of the present invention is comprised of a metal silicide layer positioned above and in contact with a source and drain region of a semiconductor device, a dielectric material positioned above said drain and source regions, said dielectric material comprised of a plurality of openings where an electrical contact to said source and drain regions will be formed. The device further comprises a barrier layer comprised of a first metal layer and a second metal layer, the first metal layer being in contact with the metal silicide layer and the first metal layer being comprised of a metal that is the same as the metal of the metal silicide layer. The device also comprises a plug comprised of a metal positioned in said openings. In yet another embodiment, the first metal layer of the barrier layer is comprised of a metal that is different from the metal of the metal silicide layer.

BRIEF DESCRIPTION OF THE DRAWINGS

The invention may be understood by reference to the following description taken in conjunction with the accompanying drawings, in which like reference numerals identify like elements, and in which.

Figure 1:
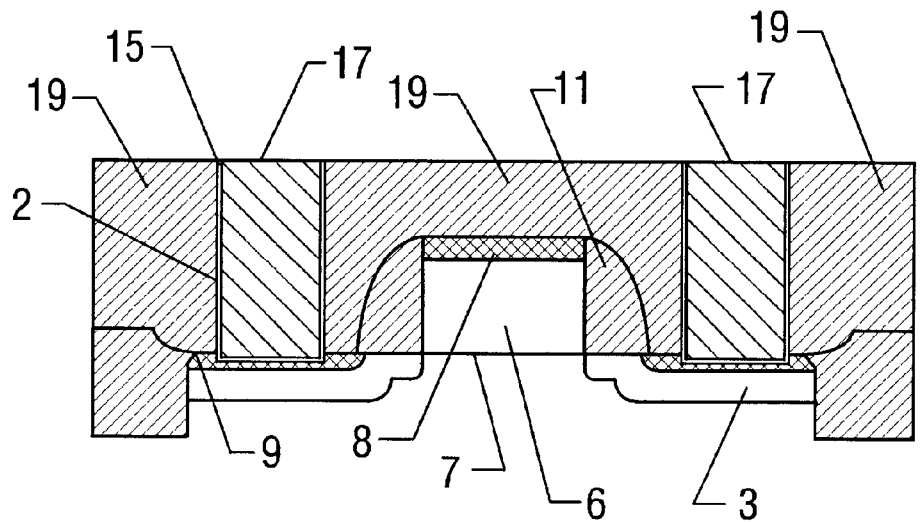
FIG. 1 is a cross-sectional view of a semiconductor topography comprising a prior art metallization.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2a–2d. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming improved electrical interconnections in a semiconductor device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 2A:
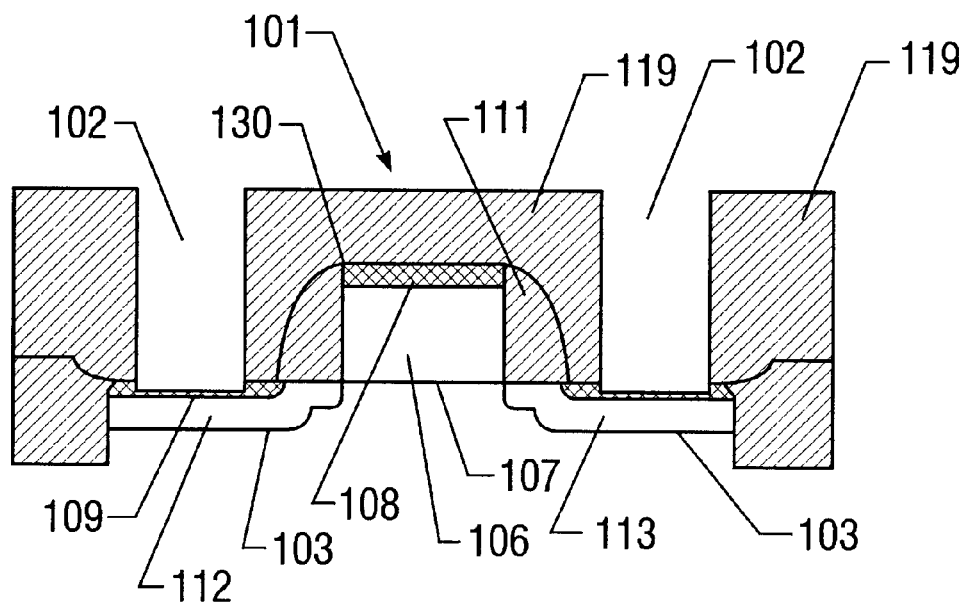
FIGS. 2a–2d are cross-sectional views of an illustrative semiconductor device depicting the processing steps according to one illustrative embodiment of the present invention.

With reference to FIGS. 2a–2d, an illustrative MOS structure and a method for fabrication thereof according to the present invention are described. FIG. 2a shows a cross-section of the topography of a MOS transistor 101. In FIG. 2a, a drain region 112 and a source region 113 are separated by a gate stack region 130 comprised of a stack of layers consisting of a gate oxide layer 107, a polysilicon layer 106 and a metal silicide layer 108.

The gate oxide layer 107 may consist of silicon dioxide ($SiO_2$), for example, but other materials known to those skilled in the art may also be used for the gate oxide layer 107. The oxide layer 107 electrically separates the underlying doped semiconductor region from the gate polysilicon layer 106 that serves as the gate conductor for the transistor. In one embodiment, the metal silicide layer 108 is comprised of cobalt silicide ($CoSi_2$), although other metal silicides may also be used. However, other refractory metals and their silicides may also be used, such as tungsten silicide ($WSi_2$), tantalum silicide ($TaSi_2$), molybdenum silicide ($MoSi_2$), and platinum silicide ($PtSi_2$), etc. The metal silicide layer 108 comprised of cobalt silicide is formed using self-aligned techniques known to those skilled in the art, comprising the steps of cobalt-deposition, a first anneal to form a high-ohmic initial silicide phase, selective removal of the non-reacted cobalt (Co) and a final rapid thermal anneal (RTA) process to form the desired low-ohmic silicide phase and reduces the contact resistance of the gate conductor.

The gate stack 130 is surrounded by a spacer layer 111 and a dielectric layer 119. Openings 102 are formed within the dielectric area 119 to expose, at the bottom of the openings 102, a cobalt silicide layer 109 formed on top of an active junction 103. The cobalt silicide layers 108 and 109 may be formed by the above-mentioned technique, although other techniques are also possible. The openings 102 may be formed using a variety of known techniques, such as those explained with reference to FIG. 1 in the introductory part of the present application. The cobalt silicide layer 109 exhibits good adhesion to the underlying drain and source regions 112, 113, respectively, and ensures that a plug metal, to be subsequently deposited, adheres well and is electrically coupled to the cobalt suicide layer 109, in particular when the plug metal is tungsten. The thickness of the initially formed cobalt silicide layer 109 is typically approximately 150–250 Å (15 to 25 mn), although other thickness ranges are also possible. However, the thickness of the initially formed cobalt silicide layer 109 is reduced during the previously performed anisotropic etching process that define the openings 102, as described above with reference to FIG. 1.

Figure 2B:
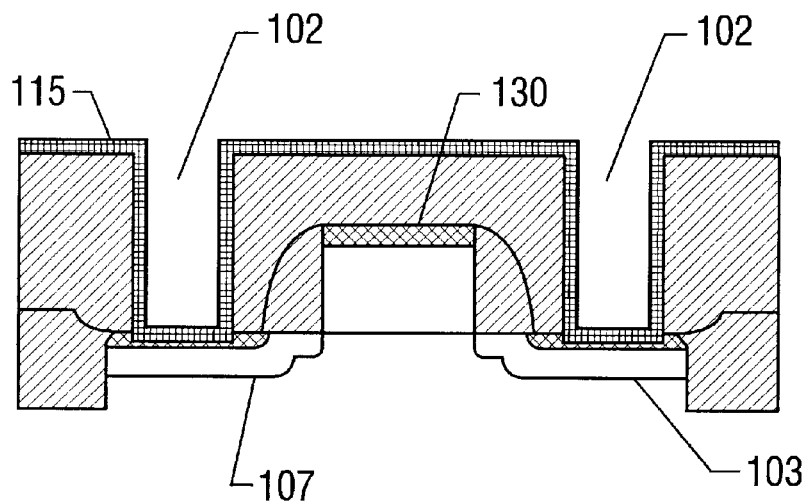

FIG. 2b shows the same arrangement as FIG. 2a, but additionally shows a barrier layer 115 on top of the wafer. In a typical prior art MOS structure, the barrier layer 115 may be comprised of one or more layers comprised of titanium nitride, titanium, tantalum, tantalum nitride, or any combination thereof. The barrier layer 115 may be formed by a variety of known processes, such as a chemical vapor deposition ("CVD") process. According to one embodiment of the present invention, the barrier layer 115 is formed of a first metal layer and a second metal layer, the first metal layer being positioned closer to the surface of the wafer. In one particular embodiment of the present invention, the barrier layer 115 is comprised of a cobalt titanium bilayer, with the cobalt layer having a thickness of approximately 80–100 Å (8–10 nm), and the titanium layer having a thickness of approximately 100 Å (10 nm). Of course, other material selections and thickness variations are possible. The barrier layer 115 may also be formed by a physical vapor deposition process, preferably by ionized metal plasma ("IMP"), so as to sufficiently cover the bottom and the sidewalls of the openings 102.

Figure 2C:
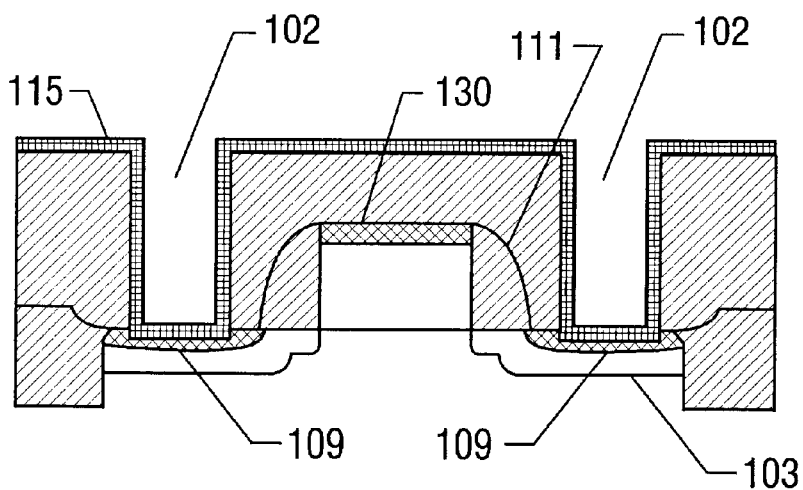

FIG. 2c shows the arrangement of FIG. 2b after a rapid thermal anneal ("RTA") process in a nitrogen ambient under standard conditions has been performed. The RTA in a nitrogen ambient converts the titanium capping layer of the barrier layer 115 into a titanium nitride layer, whereas the cobalt layer of the barrier layer 115, which is in contact with the cobalt silicide layer 109 at the bottom of the opening 102, is partly converted into cobalt silicide ($CoSi_2$), thereby increasing the thickness of the previously thinned initial cobalt silicide layer 109. Consequently, the thickness of the cobalt silicide ($CoSi_2$) layer is increased and, hence, the cobalt silicide layer of FIG. 2c exhibits a lower contact resistance than the cobalt silicide layer of FIG. 2a. Of course, other ambient gases may be used, such as ammonium ($NH_3$), depending upon the particular application, or as a matter of design choice.

Figure 2D:
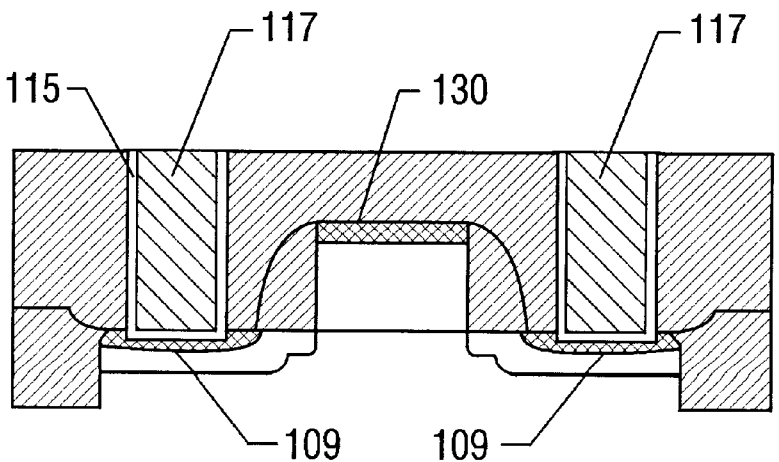

FIG. 2d shows the arrangement of FIG. 2c after the openings 102 are filled in with a plug 117, comprised of a metal, such as tungsten, to form a plug 117. This may be accomplished by, for example, a chemical vapor deposition ("CVD") process. In this situation, the upper layer of the barrier layer 115, now comprising titanium nitride, serves as a seed layer for the plug 117 comprised of tungsten. Additionally, the cobalt/titanium nitride/tungsten (Co/TiN/W) layer stack positioned outside of the openings 102 may be removed from the wafer surface by means of a chemical mechanical polishing ("CMP") process. The final thickness of the cobalt suicide layer 109 may be adjusted by properly selecting the thickness of the cobalt (Co) layer, thus forming, in conjunction with the titanium (Ti) layer, one embodiment of the barrier layer 115.

In the illustrative embodiment of the present invention described above, the metals used for forming the barrier layer 115 are cobalt (Co) and titanium (Ti), respectively, but other appropriate metals may be employed. In one embodiment, the metal of the silicide layer 109 may be the same as the metal of barrier layer 115 that is in contact with the silicide layer 109. For example, in one illustrative embodiment of the present invention, a cobalt silicide layer 109 and a cobalt/titanium bilayer barrier layer 115 may be used. However, the metal of the barrier layer 115 that is in contact with the silicide layer 109 may also be a metal that differs from the metal of the silicide layer 109. In this situation, the metal of the barrier layer 115 forms an additional metal silicide layer on top of the silicide layer 109 during the annealing process. If this technique is used, the metal is chosen so as to yield a low contact resistance to the silicide layer 109, and, in combination therewith, to the source and drain regions 113, 112 of the underlying semiconductor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a cobalt silicide layer above a surface of a wafer, said cobalt silicide layer having a thickness;
   forming a dielectric layer above said cobalt silicide layer;
   selectively removing the dielectric layer to form an opening in said dielectric layer where an electrical contact to a semiconductor functional part is to be formed;
   forming a barrier metal layer consisted of a first and a second metal, said first metal being in contact with said cobalt silicide layer, said first metal being cobalt and said second metal being titanium;
   annealing the wafer in an inert gas ambient, wherein the second metal of said barrier metal is converted into a compound formed of said second metal and the ambient gas and the first metal of said barrier layer is partly converted into cobalt silicide, thereby increasing the thickness of said cobalt silicide layer; and
   forming a plug metal in said opening.

2. The method according to claim 1, wherein the thickness of said first metal layer of said barrier metal layer is controlled so as to compensate for the material loss of said cobalt silicide layer.

3. The method according to claim 1, wherein forming a plug metal in said opening comprises forming a plug metal in said opening wherein the layer of said compound formed of said second metal of said barrier metal layer and said ambient gas during the annealing process serves as a seed layer.

4. The method according to claim 1, wherein said plug metal is comprised of tungsten.

5. The method according to claim 1, wherein said ambient gas is nitrogen ($N_2$) or ammonium ($NH_3$).

6. The method according to claim 1, wherein forming said plug metal is performed by a chemical vapor deposition process.

7. The method according to claim 1, wherein the annealing process is a rapid thermal annealing process.

8. A method, comprising:
   forming a first cobalt silicide layer on a top surface of a wafer, said first cobalt silicide layer having a thickness;

forming a dielectric layer above said first cobalt silicide layer;

selectively removing the dielectric layer to form an opening in said dielectric layer where an electrical contact to a semiconductor functional part is to be formed;

forming a barrier metal layer consisted of a first and a second metal, said first metal being in contact with said first cobalt silicide layer, said first metal being cobalt having a thickness ranging from approximately 80–100 Å and said second metal being titanium having a thickness of approximately 100 Å;

annealing the wafer in an inert gas ambient, wherein the second metal of said barrier metal layer is converted into titanium nitride and the first metal being in contact with said first cobalt silicide layer is partly converted into a second cobalt silicide layer; and forming a plug metal in said opening.

9. The method according to claim 8, wherein the thickness of said first metal layer of said barrier metal layer is controlled so as to compensate for the material loss of said first cobalt silicide layer.

10. The method according to claim 8, wherein forming a plug metal in said opening comprises forming a plug metal in said opening wherein said titanium nitride layer serves as a seed layer.

11. The method according to claim 8, wherein said plug metal is comprised of tungsten.

12. The method according to claim 8, wherein forming said plug metal is performed by a chemical vapor deposition process.

13. The method according to claim 8, wherein the annealing process is a rapid thermal annealing process.

14. A method, comprising:

forming a first metal silicide layer comprised of cobalt silicide above a surface of a wafer, said metal silicide layer having a thickness;

forming a dielectric layer comprised of silicon dioxide above said metal silicide layer;

selectively removing the dielectric layer to form an opening in said dielectric layer where an electrical contact to a semiconductor functional part is to be formed;

forming a barrier metal layer consisted of a first and a second metal, said first metal being in contact with said first metal silicide layer, said first metal being cobalt having a thickness ranging from approximately 80–100 Å and said second metal being titanium;

annealing the wafer in an inert gas ambient, wherein the second metal of said barrier metal is converted into a compound formed of said second metal and the ambient gas and the first metal of said barrier layer is partly converted into a cobalt silicide layer above said first metal silicide layer; and forming a plug metal comprised of tungsten in said opening.

15. The method according to claim 14, wherein the thickness of said first metal layer of said barrier metal layer is controlled so as to compensate for the material loss of said first metal silicide layer.

16. The method according to claim 14, wherein forming a plug metal in said opening comprises forming a plug metal in said opening wherein the layer of said compound formed of said second metal of said barrier metal layer and said ambient gas during the annealing process serves as a seed layer.

17. The method according to claim 14, wherein said ambient gas is nitrogen ($N_2$) or ammonium ($NH_3$).

18. The method according to claim 14, wherein forming said plug metal is performed by a chemical vapor deposition process.

19. The method according to claim 14, wherein the annealing process is a rapid thermal annealing process.

* * * * *